(12) United States Patent
Danilov et al.

(10) Patent No.: US 10,776,218 B2
(45) Date of Patent: Sep. 15, 2020

(54) AVAILABILITY-DRIVEN DATA RECOVERY IN CLOUD STORAGE SYSTEMS

(71) Applicant: EMC IP Holding Company LLC, Hopkinton, MA (US)

(72) Inventors: Mikhail Danilov, Saint Petersburg (RU); Konstantin Buinov, Prague (CZ)

(73) Assignee: EMC IP Holding Company LLC, Hopkinton, MA (US)

( * ) Notice: Subject to any disclaimer, the term of this patent is extended or adjusted under 35 U.S.C. 154(b) by 163 days.

(21) Appl. No.: 15/995,060

(22) Filed: May 31, 2018

(65) Prior Publication Data

US 2019/0370119 A1     Dec. 5, 2019

(51) Int. Cl.
| | |
|---|---|
| *G06F 11/00* | (2006.01) |
| *G06F 11/14* | (2006.01) |
| *H04L 29/08* | (2006.01) |
| *H03M 13/15* | (2006.01) |
| *G06F 11/10* | (2006.01) |

(52) U.S. Cl.
CPC ...... *G06F 11/1464* (2013.01); *G06F 11/1088* (2013.01); *H03M 13/154* (2013.01); *H04L 67/1097* (2013.01)

(58) Field of Classification Search
CPC ............. G06F 11/1084; G06F 11/1088; G06F 11/1092; G06F 11/16; G06F 11/1612; G06F 11/1666; G06F 11/2053; G06F 11/2094

USPC .......................................................... 714/6.2
See application file for complete search history.

(56) References Cited

U.S. PATENT DOCUMENTS

| | | | | |
|---|---|---|---|---|
| 9,098,447 | B1* | 8/2015 | Donlan ................ | H03M 13/15 |
| 2008/0222481 | A1* | 9/2008 | Huang ............... | H03M 13/1191 |
| | | | | 714/752 |
| 2010/0192018 | A1* | 7/2010 | Aiyer .................... | G06F 11/008 |
| | | | | 714/37 |
| 2012/0120819 | A1* | 5/2012 | Regev .................... | H04L 43/50 |
| | | | | 370/252 |
| 2013/0339795 | A1* | 12/2013 | Petri ................... | G05B 23/0262 |
| | | | | 714/37 |
| 2015/0220400 | A1* | 8/2015 | Resch ................. | G06F 11/1464 |
| | | | | 714/6.2 |
| 2017/0060698 | A1* | 3/2017 | Noe ...................... | G06F 12/0246 |
| 2017/0161148 | A1* | 6/2017 | Vairavanathan ..... | G06F 11/1435 |
| 2017/0242732 | A1* | 8/2017 | Vairavanathan ..... | G06F 11/1489 |
| 2019/0155708 | A1* | 5/2019 | Yoon ................... | G06F 11/1076 |

* cited by examiner

*Primary Examiner* — Sarai E Butler
(74) *Attorney, Agent, or Firm* — Amin, Turocy & Watson, LLP

(57) ABSTRACT

Erasure coding is utilized to facilitate data protection in several high-end storage systems. After a failure, the system commences the process of data recovery. Typically, the system can detect data portions impacted by the failure. In one aspect, the system can trigger recovery of the impacted data portions in a sequence that reduces a probability of data losses and a probability of temporary read failures.

20 Claims, 11 Drawing Sheets

_US 10,776,218 B2_

AVAILABILITY-DRIVEN DATA RECOVERY IN CLOUD STORAGE SYSTEMS

TECHNICAL FIELD

The subject disclosure relates generally to storage systems. More specifically, this disclosure relates to availability-driven data recovery in cloud storage systems.

BACKGROUND

The large increase in amount of data generated by digital systems has created a new set of challenges for data storage environments. Traditional storage area network (SAN) and/or network-attached storage (NAS) architectures have not been designed to support data storage and/or protection at large multi-petabyte capacity levels. Object storage technology can be utilized to meet these requirements. By utilizing object storage technology, organizations can not only keep up with rising capacity levels, but can also store these new capacity levels at a manageable cost point.

Typically, a scale-out, cluster-based, shared-nothing object storage that employs a microservices architecture pattern, for example, an Elastic Cloud Storage (ECS™) can be utilized as a storage environment for a new generation of workloads. ECS™ utilizes the latest trends in software architecture and development to achieve increased availability, capacity use efficiency, and performance. ECS™ is a cloud-based object storage appliance, wherein the storage control software and the physical magnetic disk media are combined as an integrated system with no access to the storage media other than through the ECS™. ECS™ is an append-only virtual storage platform that protects content from being erased or overwritten for a specified retention period. ECS™ does not employ traditional data protection schemes like mirroring or parity protection. Instead, ECS™ utilizes erasure coding for data protection, wherein a data chunk is broken into fragments, expanded, and encoded with redundant data pieces and then stored across a set of different locations or storage media.

The above-described background relating to storage systems is merely intended to provide a contextual overview of some current issues, and is not intended to be exhaustive. Other contextual information may become further apparent upon review of the following detailed description.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its sole purpose is to present some concepts of the specification in a simplified form as a prelude to the more detailed description that is presented in this disclosure.

Example systems and methods, and other embodiments, disclosed herein relate to availability-driven data recovery in storage systems. In one example embodiment, a system is disclosed that comprises a processor and a memory that stores executable instructions that, when executed by the processor, facilitate performance of operations. Moreover, the operations comprise determining a sequence for a recovery of erasure-coded fragments of data chunks stored within a cloud storage system, wherein the sequence is determined to reduce a likelihood of a data loss event and a data unavailability event associated with the data chunks. The data loss event comprises a first error condition that occurs in response to determining that a defined number of first erasure-coded fragments of a first data chunk of the data chunks are lost, and the data unavailability event comprises a second error condition that occurs in response to determining that second erasure-coded fragments of a second data chunk of the data chunks are unavailable when a read request has been received for the second data chunk. Further, the operations comprise facilitating the recovery of the erasure-coded fragments in the sequence.

Another example embodiment of the specification relates to a method that comprises determining, by a system comprising a processor, a group of data chunks having one or more missing erasure-coded fragments, wherein the determining comprises determining the group of data chunks in a first sequence. Further, the method comprises sorting the group of data chunks to reduce a first probability of a data loss event, wherein the data loss event comprises a first error that is to be generated in response to determining that at least a defined number of first erasure-coded fragments of a first data chunk of the group of data chunks are lost; and re-sorting a subgroup of the group of data chunks to reduce a second probability of a data unavailability event, wherein the data unavailability event comprises a second error that to be generated in response to determining that second erasure-coded fragments of a second data chunk of the group of data chunks are unavailable when a read request has been received for the second data chunk, and wherein the re-sorting results in a determined sequence of the group of data chunks. Furthermore, the method comprises initiating a recovery of the group of data chunks in the determined sequence.

Another example embodiment of the specification relates to a computer-readable storage medium comprising instructions that, in response to execution, cause a computing node device comprising a processor to perform operations, comprising determining a sequence for a recovery of erasure-coded fragments of data chunks stored within a cloud storage system, wherein the sequence is determined to decrease a frequency of a potential data loss event and a potential data unavailability event associated with the data chunks, wherein the potential data loss event comprises a first error condition that occurs in response to determining that a defined number of first erasure-coded fragments of a first data chunk of the data chunks are lost, and wherein the potential data unavailability event comprises a second error condition that occurs in response to determining that second erasure-coded fragments of a second data chunk of the data chunks are unavailable when a read request has been received for the second data chunk; and facilitating the recovery of the erasure-coded fragments in the sequence.

The following description and the drawings set forth certain illustrative aspects of the specification. These aspects are indicative, however, of but a few of the various ways in which the principles of the specification may be employed. Other advantages and novel features of the specification will become apparent from the detailed description of the specification when considered in conjunction with the drawings.

DETAILED DESCRIPTION

Figure 1:
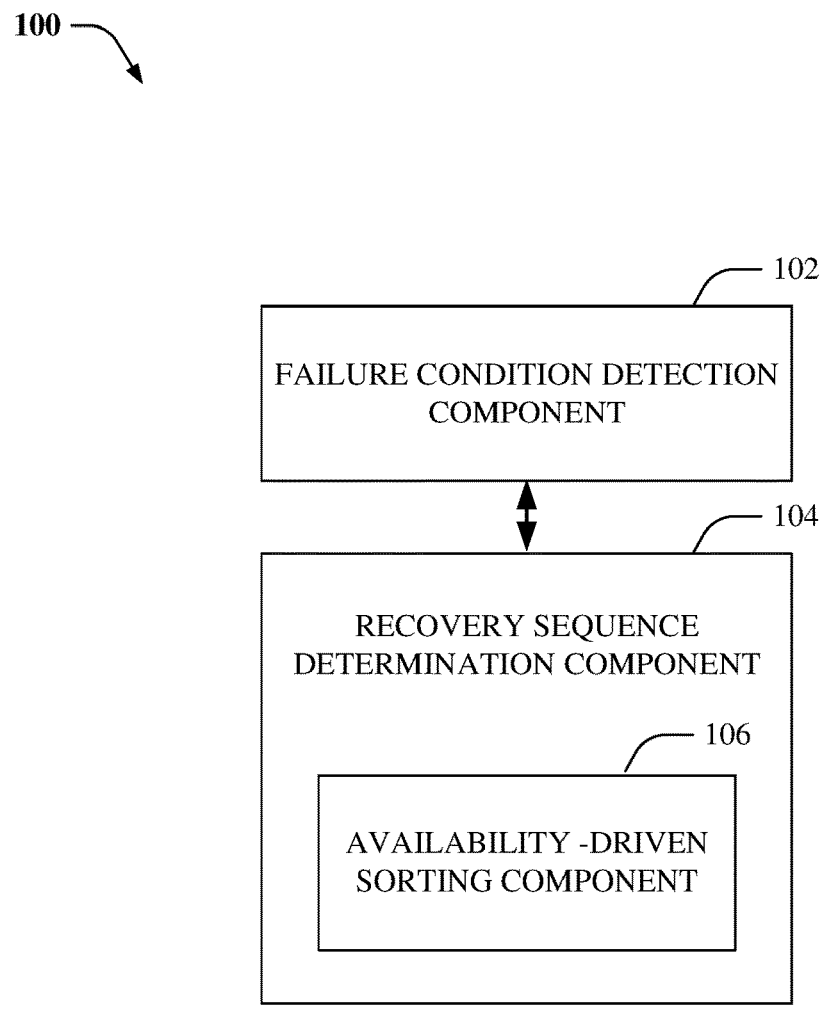
FIG. 1 illustrates an example system that facilitates availability-driven data recovery.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

The term "cloud" as used herein can refer to a cluster of nodes (e.g., set of network servers), for example, within a distributed object storage system, that are communicatively and/or operatively coupled to each other, and that host a set of applications utilized for servicing user requests. In general, the cloud computing resources can communicate with user devices via most any wired and/or wireless communication network to provide access to services that are based in the cloud and not stored locally (e.g., on the user device). A typical cloud-computing environment can include multiple layers, aggregated together, that interact with each other to provide resources for end-users.

Example systems and methods disclosed herein, in one or more embodiments, relate to cloud storage systems that utilize erasure coding for data protection, such as, but not limited to an elastic cloud storage (ECS™) platform. The ECS™ platform combines the cost advantages of commodity infrastructure with the reliability, availability and serviceability of traditional arrays. In one aspect, the ECS™ platform can comprise a cluster of nodes (also referred to as "cluster" herein) that delivers scalable and simple public cloud services with the reliability and/or control of a private-cloud infrastructure. Moreover, the ECS™ platform comprises a scale-out, cluster-based, shared-nothing object storage, which employs a microservices architecture pattern. The ECS™ platform can support storage, manipulation, and/or analysis of unstructured data on a massive scale on commodity hardware. As an example, ECS™ can support mobile, cloud, big data, content-sharing, and/or social networking applications. ECS™ can be deployed as a turnkey storage appliance or as a software product that can be installed on a set of qualified commodity servers and/or disks. The ECS™ scale-out and geo-distributed architecture is a cloud platform that can provide at least the following features: (i) lower cost than public clouds; (ii) unmatched combination of storage efficiency and data access; (iii) anywhere read/write access with strong consistency that simplifies application development; (iv) no single point of failure to increase availability and performance; (v) universal accessibility that eliminates storage silos and inefficient extract, transform, load (ETL)/data movement processes; etc.

In an aspect, ECS™ does not rely on a file system for disk capacity management. Instead, ECS™ partitions disk space into a set of blocks of fixed size called chunks (e.g., having a chunk size of 128 MB). All user data is stored in these chunks and the chunks are shared. Typically, a chunk can comprise fragments of several different user objects. The chunk content can be modified in an append-only mode. When a chunk becomes full, it can be sealed and the content of a sealed chunk is immutable. Further, ECS™ does not employ traditional data protection schemes like mirroring or parity protection. Instead, ECS™ utilizes erasure coding for protection of the data chunks. During erasure coding, a chunk can be divided into k data fragments of equal size. To encode the chunk, redundant m coding fragments are created so that the system can tolerate the loss of any m fragments. The process of generating the coding fragments is called encoding. The process of data fragments recovery using available data and coding fragments is called decoding. As an example, the encoding operation can be represented with the equation below:

$$C_i = \Sigma_{j=1}^{k} C_{i,j} \quad (1)$$

wherein, $$C_{i,j} = X_{i,j} * D_j \quad (2)$$

and wherein, $X_{i,j}$ is a defined coefficient from a coding matrix (e.g., wherein i, j, and/or k can be most any integer). Further, $D_j$ are independent data fragments and $C_i$ are coding fragments. Although the systems and methods disclosed herein have been described with respect to object storage systems (e.g., ECS™), it is noted that the subject specification is not limited to object storage systems and can be utilized for most any storage systems that utilize erasure coding for data protection and chunks for disk capacity management. Thus, any of the embodiments, aspects, concepts, structures, functionalities or examples described herein are non-limiting, and the technology may be used in various ways that provide benefits and advantages in computing and data storage in general.

Referring initially to FIG. 1, there illustrated is a system 100 that facilitates availability-driven data recovery in accordance with an aspect of the subject disclosure. System 100 can be utilized for data recovery in most any storage systems (e.g., ECS™) that utilize erasure coding for data protection. In one aspect, a failure condition detection component 102 can monitor system and/or node health and determine that a failure condition has occurred. For example, a failure condition can comprise a loss and/or unavailability of data (e.g., one or more data and/or coding fragments of a chunk) due to various factors such as, but not limited to, data corruption, hardware failures, data center disasters, natural disasters, malicious attacks, etc. On detecting a failure condition, the failure condition detection component 102 can further determine the chunks that have been affected by the failure condition. For example, the failure condition detection component 102 can determine chunks that have one or more lost and/or unavailable coding and/or data fragments due to the failure condition based on data records stored within a chunk table (not shown). Typically, a chunk table can store information about chunks, for example, the number and/or location of data and/or coding fragments of each chunk.

After a failure, systems commence the process of data recovery. Conventional systems detect impacted data portions and trigger their recovery as they are detected. This basic method for data recovery is simplistic but does not use information about a specific type of damage made to reduce a probability of potential data unavailability and/or data loss (DU/DL) events. In other words, the conventional method is not availability-driven. Consider an example scenario wherein two data portions (A and B) are determined to be impacted by a failure. In this example, data portion A has lost one coding fragment and data portion B has lost m data fragments. If conventional systems detect data portion A as being impacted before detecting data portion B, the system recovery starts with data portion A and finishes with data portion B. However, this approach is inefficient from at least the following perspectives: (i) Data portion B is more vulnerable than data portion A because it cannot lose a single fragment without data loss, while data portion A still can lose m−1 fragments without data loss. Therefore, data portion B should be handled before data portion A; (ii) Data portion A has not lost any data fragments. Thus, there is no immediate impact on read operations for data portion A. On the contrary, at least part of read requests for data portion B can fail with a "data unavailable" error. Therefore, again, data portion B should be handled before data portion A.

Accordingly, a recovery sequence determination component 104 can be utilized by system 100 to facilitate recovery of data chunks impacted by a failure condition in an efficient manner that reduces a probability of potential DU/DL events. In an aspect, an availability-driven sorting component 106 can be utilized to rank and/or sort the data chunks in a sequence that reduces a probability of DU/DL events. Moreover, the data chunks can be recovered in the determined sequence by performing a decoding process (e.g., that employs a decoding matrix corresponding to a coding matrix utilized during erasure coding of the data chunks).

Figure 2:
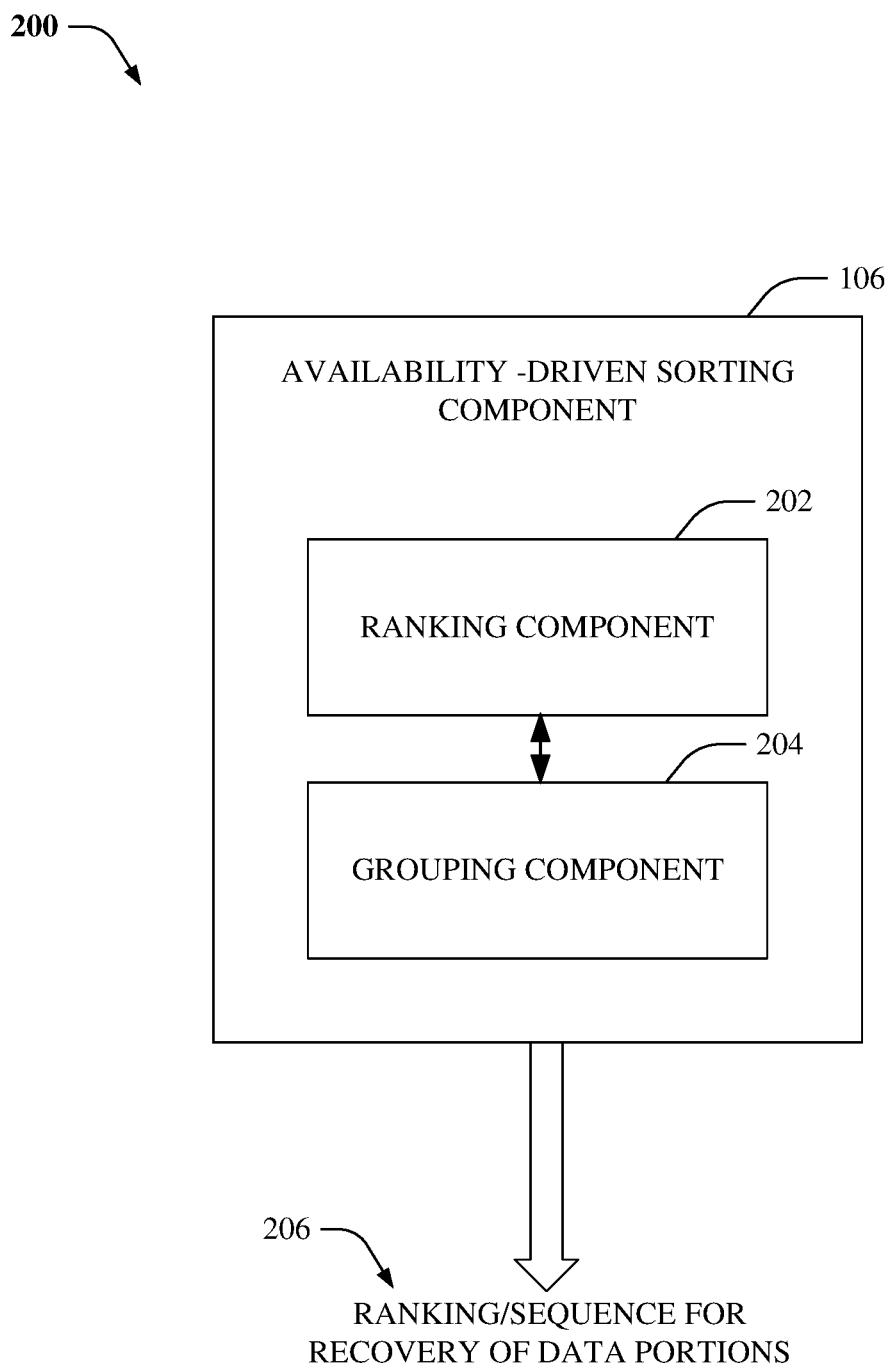
FIG. 2 illustrates an example system for sorting a list of data chunks that are to be recovered after a failure has been detected.

FIG. 2 illustrates an example system 200 for sorting a list of data chunks that are to be recovered after a failure has been detected in accordance with an aspect of the specification. In an aspect, the sequence of data recovery is determined to decrease a probability of DL and DU events during the recovery process. As an example, the availability-driven sorting component 106 can include functionality as more fully described herein, for example, as described above with regard to system 100.

Typically, a storage system can utilize a k+m erasure coding protection scheme, wherein a data block (e.g., data chunk) is divided into k data fragments and m coding fragments are created (e.g., by encoding the k data fragments). Encoding is performed in a manner such that the system can tolerate the loss of any m fragments. In other words, the data chunk can be recovered even if m fragments are lost and/or unavailable. A DL event can occur if more than m fragments are lost and/or unavailable. Further, if a data read request is received when one or more data fragments of the data chunk are lost, unavailable, and/or queued for recovery, a DU event can occur.

To reduce a probability of DU events, the system can sort the affected data portions based on a number of missing data fragments in a descending order and can recover the data portions starting with data portions that have the greatest number of missing data fragments. Alternatively, to reduce a probability of DL events, the system can sort the affected data portions based on a total number of missing data and coding fragments in a descending order and can recover the data portions starting with data portions that have the greatest number of missing data and coding fragments. These two sorting techniques utilize different and independent sorting parameters. However, system 200 facilitates a truly availability-driven data recovery that reduces probability of both DU and DL events by utilizing ranking component 202 and a grouping component 204 to optimally sort the affected data portions to reduce both DL and DU probabilities.

In an aspect, the ranking component 202 can receive a list of data portions that are impacted by (e.g., lost, unavailable, corrupted, etc.) one or more failure conditions. The ranking component 202 can determine a total number of missing fragments (e.g., summation of missing coding fragments and missing data fragments) of each data portion and sort the data portions based on this number in descending order. Further, the grouping component 204 can divide the sorted data portions into m groups, wherein each group comprises data portions that have the same total number of missing data and coding fragments. Furthermore, the ranking component can re-sort the data portions within each group based on the number of missing data fragments of the data portions in a descending order to generate a ranking, weighting, and/or sequence 206 for recovery of data portions. Moreover, data recovery can be initiated based on the specified ranking/weighting/sequence 206. For example, data portions with the greatest number of missing data and coding fragments and the greatest number of missing data fragments can be recovered first.

Figure 3:
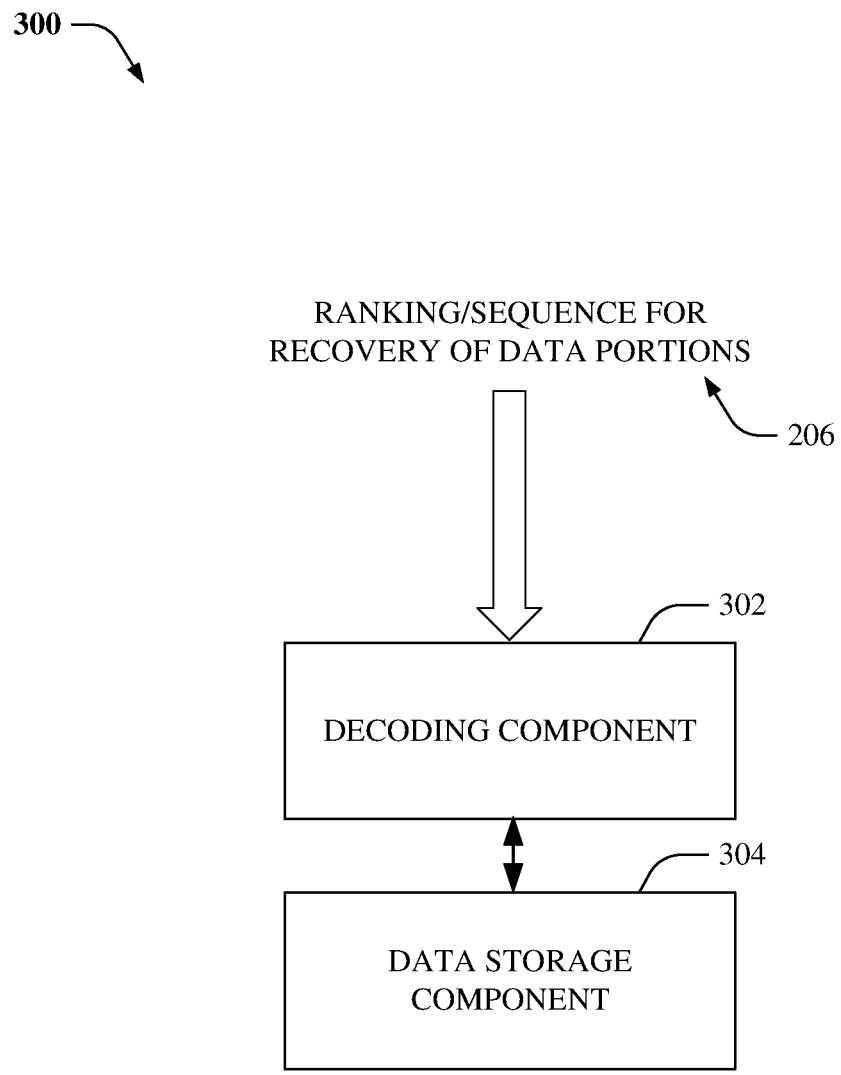
FIG. 3 illustrates an example system that facilitates efficient data recovery, according to an aspect of the subject disclosure.

Referring now to FIG. 3, there illustrated is an example system 300 that facilitates efficient data recovery, according to an aspect of the subject disclosure. Typically, on detecting a failure of a node or a drive in the site, a storage engine can identify chunks and/or erasure-coded fragments affected by the failure (e.g., via the failure condition detection component 102) and generate a ranking, weighting, and/or sequence 206 for the recovery of data portions (e.g., via the recovery sequence determination component 104).

In one aspect, the ranking, weighting, and/or sequence 206 can be provided to a decoding component 302. The decoding component 302 can perform recovery of the data chunks in the specified order/sequence. For example, the decoding component 302 can employ a decoding matrix that corresponds to the coding matrix utilized during erasure coding. The decoding results in a recovery of the data fragments, which can then be written to and stored within good, healthy, and/or available nodes by employing the data storage component 304.

Figure 4:
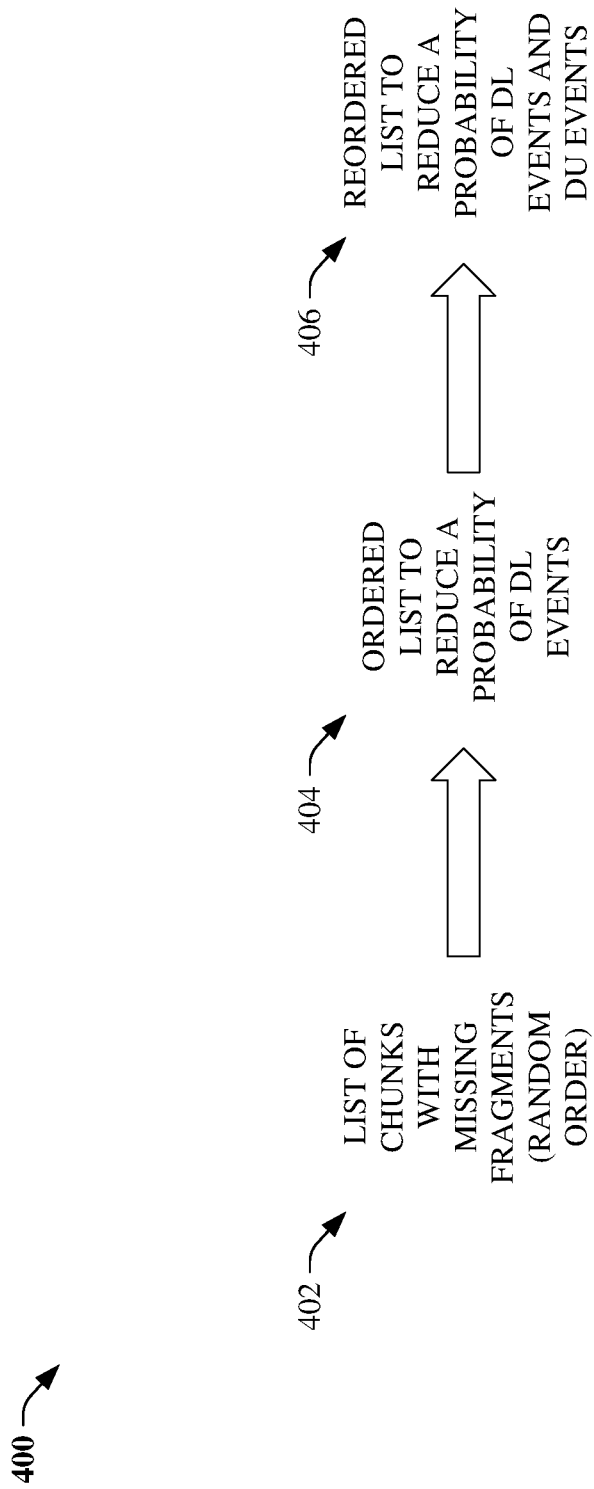
FIG. 4 illustrates an example system for determining a sequence for data recovery of data chunks.

FIG. 4 illustrates an example flow diagram 400 for determining a sequence for data recovery of data chunks in accordance with an aspect of the subject disclosure. At 402 a list of chunks with missing fragments can be determined. As an example, the list is determined (e.g., populated) in an order in which the chunks are detected, for example, by querying a chunk table. Initially, the list is sorted based on a total number of missing (and/or unavailable) data and coding fragments of the chunks to generate an ordered list 404 that reduces a probability of DL events. Further, the list 404 is segmented into groups, which are individually resorted based on a number of missing (and/or unavailable) data fragments of the chunks to generate a re-ordered list 406 that reduces a probability of DL events and DU events. In an aspect, data recovery is performed based on the sequence specified by the list 406. For example, recovery of data chunks having the greatest number of missing data and coding fragments and the greatest number of missing data fragments is prioritized.

Figure 5A:
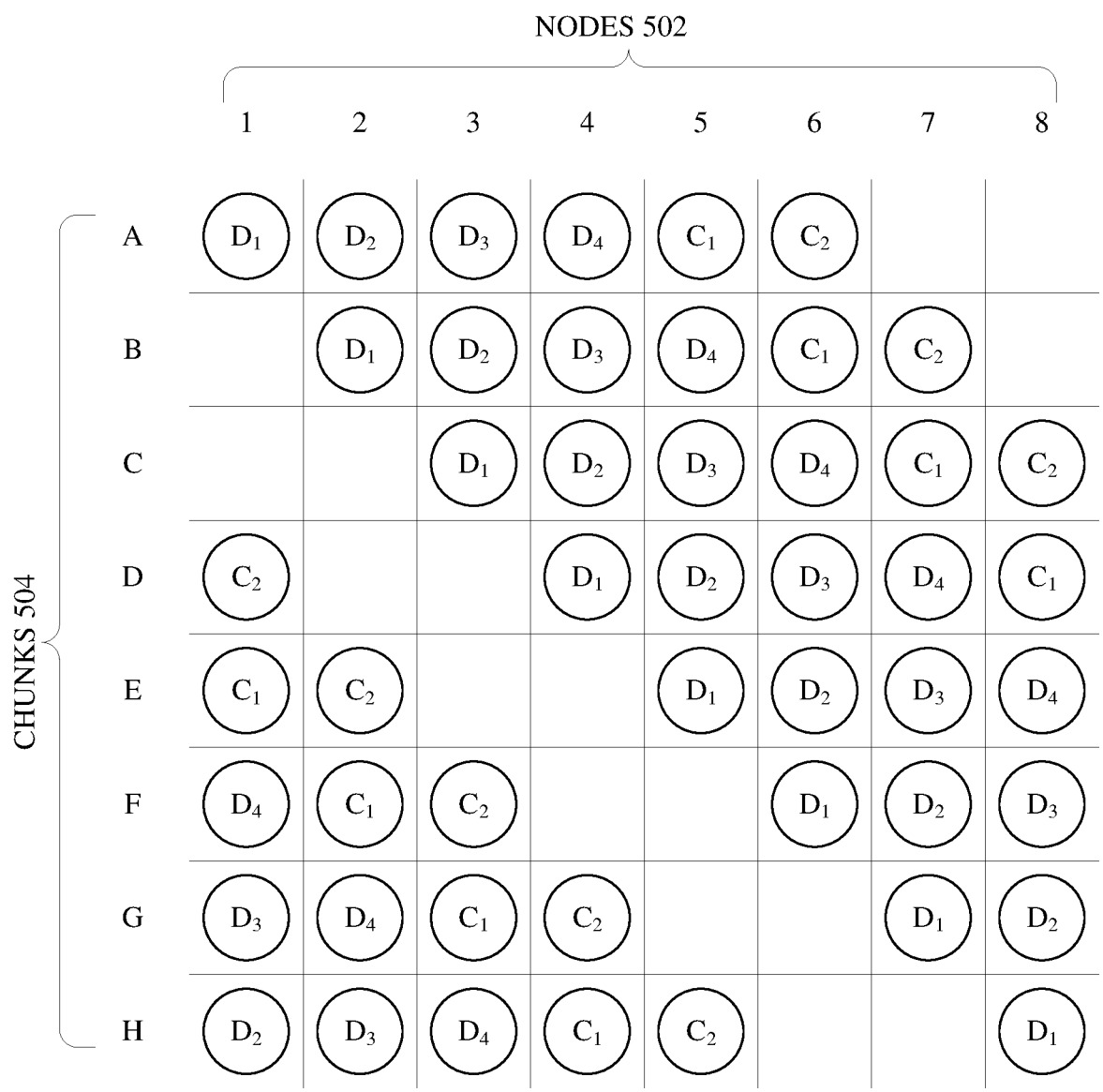
FIGS. 5A-5B illustrate example systems that depict a failure condition that initiates data recovery, according to an aspect of the subject disclosure.
Figure 5B:
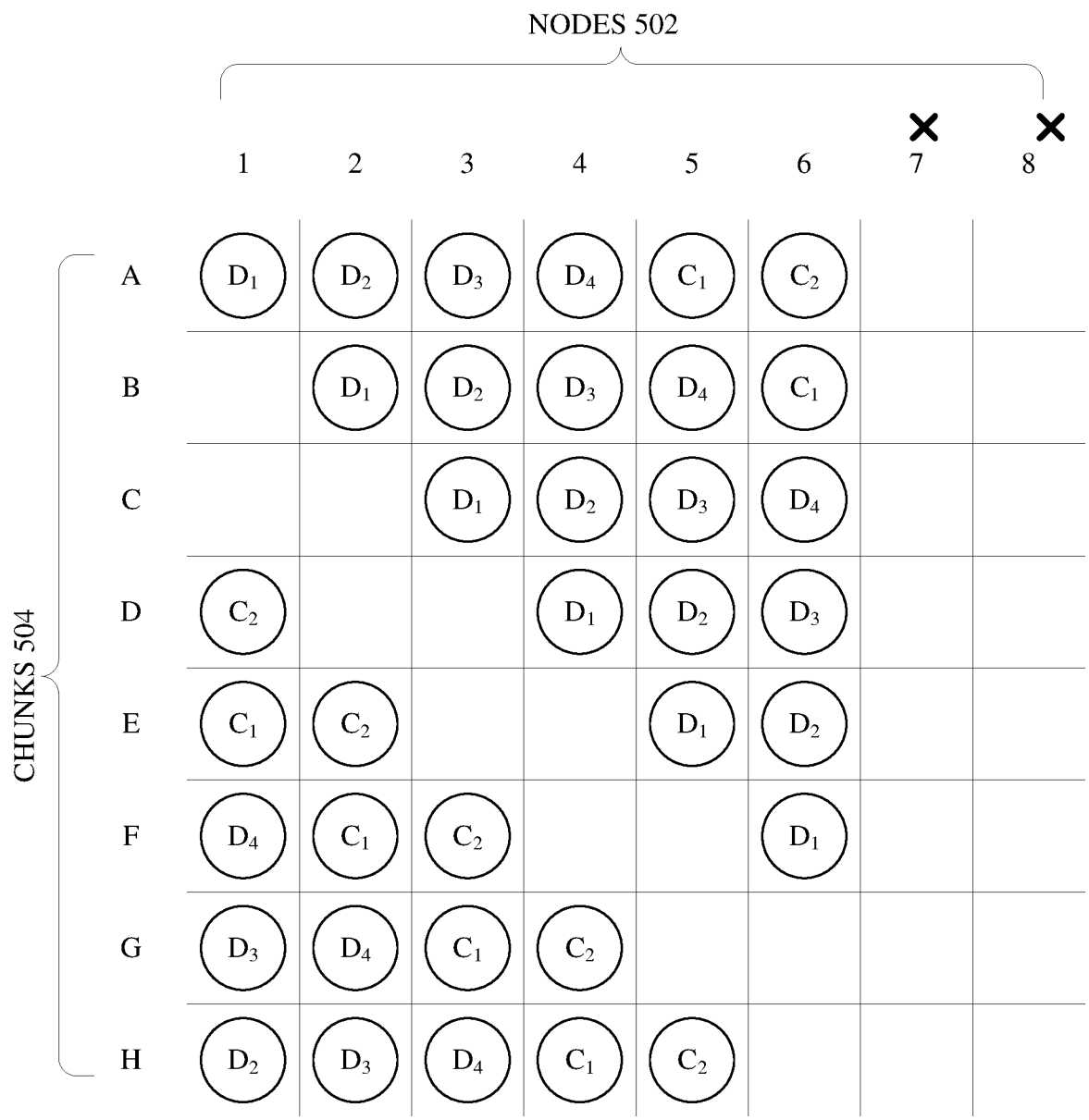

FIGS. 5A-5B illustrate example systems 500 and 550 that depict a failure condition that initiates data recovery, according to an aspect of the subject disclosure. In an aspect, disk space of the storage system can be partitioned into a set of blocks of fixed size called chunks. As an example, the chunk size can be 128 MB. Typically, user data is stored in these chunks and the chunks are shared. Moreover, a chunk can comprise segments of several user objects. Chunk content is modified in an append-only mode. When the chunk becomes full enough, it is sealed. After the chunk is sealed, its content is immutable. According to an aspect, the chunk can be protected by employing erasure coding. During erasure coding, a chunk can be divided into k data fragments of equal size. To encode the chunk, redundant m coding fragments are created so that the system can tolerate the loss of any m fragments.

Systems 500 and 550 depict an example storage system comprising an eight-node cluster 502 that stores erasure-coded fragments of eight data chunks 504. It is noted that the subject disclosure is not limited to an 8-node cluster and the storage system can have fewer and/or greater number of nodes that store erasure-coded fragments of two or more data chunks. In this example, a 4+2 (k=4 and m=2) erasure protection scheme has been utilized for protecting chunks 504. Typically, the storage system continuously monitors the health of the nodes, their disks, and objects stored in the cluster 502. As an example, the storage system can disperse data protection responsibilities across the cluster and automatically re-protects at-risk objects when nodes and/or disks fail.

System 550 depicts an example dual-node failure condition wherein nodes 7 and 8 are unavailable and/or unresponsive. On detecting the failure condition, a storage engine (not shown) of the storage system can identify the chunks and/or erasure coded fragments affected by the failure and can initiate recovery of the affected data.

Figure 6:
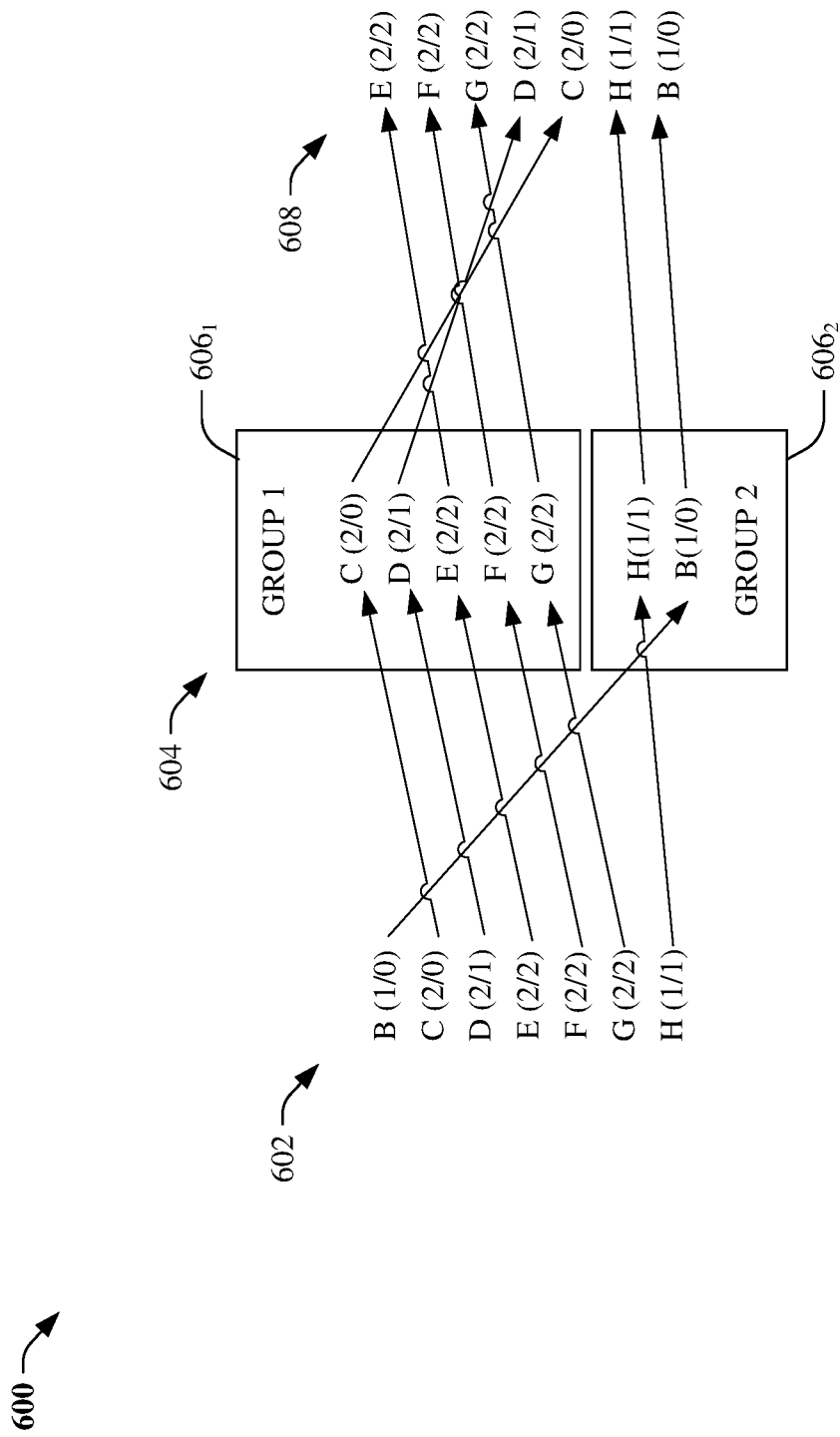
FIG. 6 illustrates an example embodiment that depicts sequences that are utilized to reduce probabilities of data loss (DL) and data unavailability (DU) events.

FIG. 6 illustrates an example embodiment 600 that depicts sequences that are utilized to reduce probabilities of DL and DU events in accordance with an aspect of the subject disclosure. Continuing with the above example, wherein a dual-node failure is detected, the storage system (e.g., via failure condition detection component 102) can identify a list of chunks that are affected by the failure. for example, list 602 depicts a list of chunks (B-H) that have one or more missing fragments due to the failure. The sequence of the chunks (B-H) is random and/or in the order in which they are detected. In this example, the chunks are represented in the following format: chunk name (number of missing data and coding fragments/number of missing data fragments). At 604, the list of chunks is stored based on the number of missing data and coding fragments and arranged in a descending order. In one aspect, sorted list of chunks is divided into two (m=2) groups, group 1 606$_1$ and group 2 606$_2$. Group 1 606$_1$ comprises chunks that have two missing fragments and group 2 606$_2$ comprises chunks that have one missing fragment. At 608, the chunks within each group is further sorted based on the number of missing data fragments and arranged in a descending order. The list 608 represents a sequence in which the chunks are to be recovered to reduce the probability of both DL and DU events. For example, data recovery is to be performed in the sequence chunk E, chunk F, chunk G, chunk D, chunk C, chunk H, and then chunk B. In an aspect, the recovered data is written to good nodes and disks, for example, nodes 1-7.

The disclosed sorting mechanism utilizes sorting based on two different parameters to ensure that the most vulnerable and the most damaged data portions are recovered first. It is noted that the sorting based on the number of missing data fragments also reduces the total amount of lost data fragments if data loss, despite all the efforts, is to occur.

Figure 7:
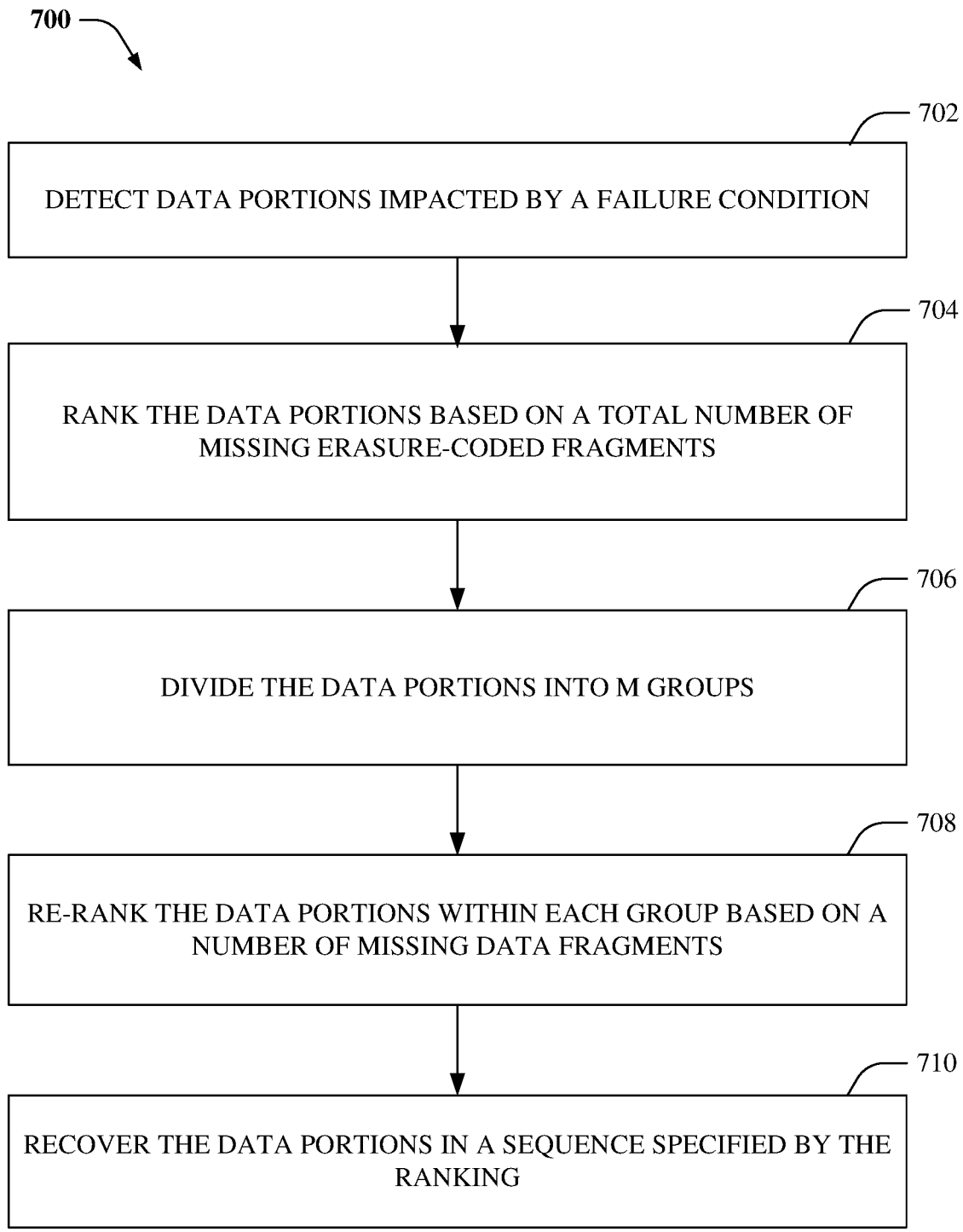
FIG. 7 illustrates an example method for efficient data recovery, according to an aspect of the subject disclosure.

FIG. 7 illustrates flow diagrams and/or methods in accordance with the disclosed subject matter. For simplicity of explanation, the flow diagrams and/or methods are depicted and described as a series of acts. It is to be understood and appreciated that the various embodiments are not limited by the acts illustrated and/or by the order of acts, for example acts can occur in various orders and/or concurrently, and with other acts not presented and described herein. Furthermore, not all illustrated acts may be required to implement the flow diagrams and/or methods in accordance with the disclosed subject matter. In addition, those skilled in the art will understand and appreciate that the methods could alternatively be represented as a series of interrelated states via a state diagram or events. Additionally, it should be further appreciated that the methods disclosed hereinafter and throughout this specification are capable of being stored on an article of manufacture to facilitate transporting and transferring such methods to computers. The term article of manufacture, as used herein, is intended to encompass a computer program accessible from any computer-readable device or computer-readable storage/communications media.

Referring now to FIG. 7, there illustrated is an example method 700 for efficient data recovery, according to an aspect of the subject disclosure. In an aspect, method 700 can be performed within an object storage system, for example, ECS™. Typically, the object storage system employs a method for disk capacity management, wherein the disk space is partitioned into a set of blocks of fixed/defined size (e.g., 128 MB) called chunks. All user data can be stored in the chunks and the chunks can be shared between different users. For example, a chunk can comprise fragments of several dozens of user objects. However, one chunk can also comprise fragments of thousands of user objects (e.g., in case of email archives). Chunk content can be modified in an append-only mode. When a chunk becomes full enough, it can be sealed and once sealed, the content of the chunk is immutable. Chunks can be protected by employing an erasure coding protection protocol. When a failure condition occurs, the chunks can be recovered by employing a decoding process. Moreover, at 702, data portions (e.g., chunks) impacted by the failure condition can be detected. As an example, the failure condition can result in one or more erasure-coded fragments of some of the data portion to be missing, lost, and/or unavailable.

At 704, the data portions can be ranked based on a total number of missing erasure-coded fragments. For example, a first data portion that has a greater number of missing erasure-coded fragments than a second data portion can be assigned a higher rank than the second data portion. At 706, the data portions can be divided into m groups, wherein data portions within each group have the same number of missing erasure-coded fragments. Further, at 708, the data portions within each group can be re-ranked based on the number of missing data fragments. For example, a first data portion that has a greater number of missing data fragments than a second data portion can be assigned a higher rank than the second data portion. Furthermore, at 708, the data portions can be recovered in a sequence specified by the ranking. For example, the higher-ranked data portion can be recovered before a lower-ranked data portion. This sequence of data recovery can reduce potential DL and DU events.

Figure 8:
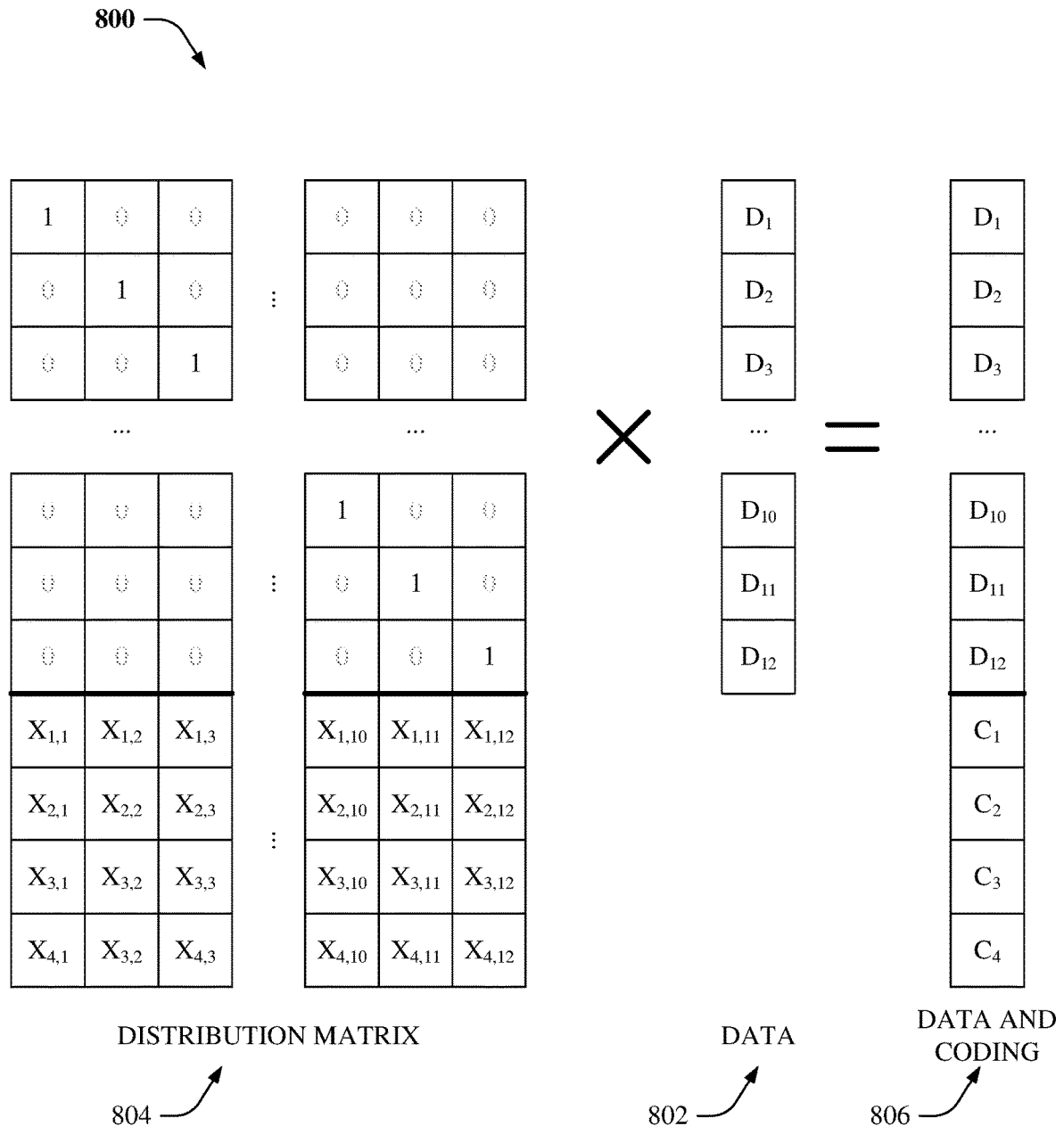
FIG. 8 illustrates an example system that facilitates matrix-based erasure coding.

FIG. 8 illustrates an example system 800 that facilitates matrix-based erasure coding, according to an aspect of the subject disclosure. In an aspect, the storage system can utilize erasure coding for data protection. Typically, a k+m protection protocol can be utilized, wherein data and coding fragments are a matrix-vector product. The vector consists of k data fragments 802. Further, the matrix is called a Distribution Matrix 804 of (k+m)×k size. The first k rows of the distribution matrix compile a k×k identity matrix. The bottom m rows of the distributed matrix are called the Coding Matrix. Coefficients $X_{i,j}$ are defined in a variety of ways depending on erasure coding algorithm used.

During encoding, the distribution matrix 804 is multiplied by a vector 802 and produces a product vector 806 comprising both the data and the coding fragments. Thus, the encoding process comprises m dot products of the coding matrix with the data. When some data fragments are lost, the missing fragments are restored using the same math but with a corresponding decoding matrix (not shown).

Figure 9:
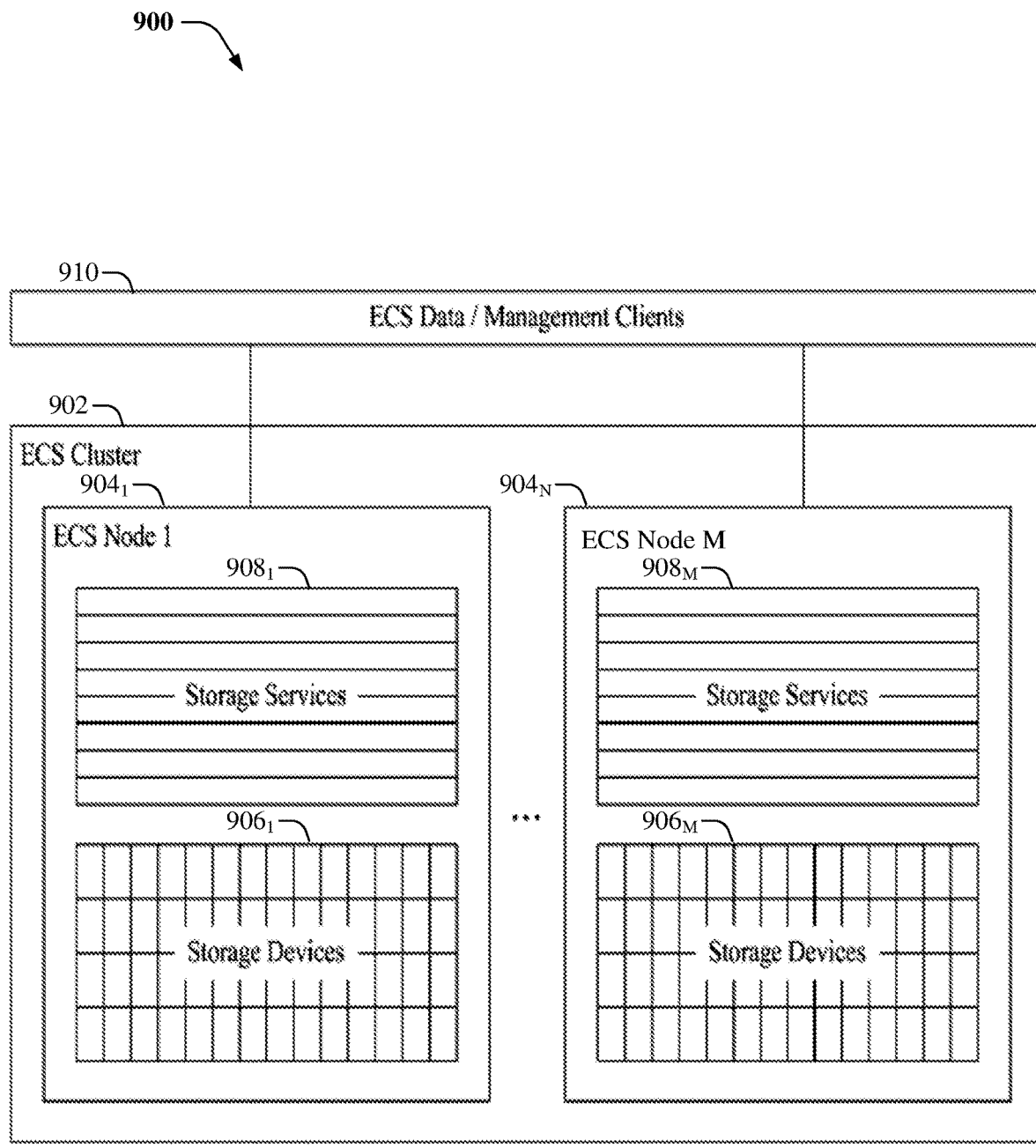
FIG. 9 illustrates high-level architecture of an Elastic Cloud Storage (ECS™) cluster that facilitates enhanced data protection and/or recovery via meta chunks.

FIG. 9 illustrates an example high-level architecture 900 of an ECS™ cluster, according to an aspect of the subject disclosure. ECS™ can comprise a software-defined, cloud-scale, object storage platform that combines the cost advantages of commodity infrastructure with the reliability, availability and serviceability of traditional arrays. With ECS™, an organization can deliver scalable and simple public cloud services with the reliability and control of a private-cloud infrastructure. ECS™ provides comprehensive protocol support for unstructured (object and/or file) workloads on a single, cloud-scale storage platform. In an aspect, the ECS™ cluster 902 can comprise multiple nodes $904_1$-$904_M$, wherein M is most any integer. It is noted that the nodes $904_1$-$904_M$ can be substantially similar to nodes 502 described herein. The nodes $904_1$-$904_M$ can comprise storage devices (e.g. hard drives) $906_1$-$906_M$ and can run a set of services $908_1$-$908_M$. For example, single node that runs ECS™ version 3.0 can manage 20 independent services. Further, ECS™ data/management clients 910 can be coupled to the nodes $904_1$-$904_M$.

The ECS™ cluster 902 does not protect user data with traditional schemes like mirroring or parity protection. Instead, the ECS™ cluster 902 utilizes a k+m erasure coding protection scheme, wherein a data block (e.g., data chunk) is divided into k data fragments and m coding fragments are created (e.g., by encoding the k data fragments). Encoding is performed in a manner such that the ECS™ cluster 902 can tolerate the loss of any m fragments. As an example, the default scheme for ECS™ is 12+4, i.e. k equals to 12 and m equals to 4; however, the subject disclosure is not limited to this erasure coding protection scheme. When some fragments are lost, the missing fragments are restored via a decoding operation.

In one aspect, the storage services $908_1$-$908_M$ can handle data availability and protection against data corruption, hardware failures, and/or data center disasters. As an example, the storage services $908_1$-$908_M$ can comprise an unstructured storage engine (USE) (not shown), which is a distributed shared service that runs on each node $904_1$-$904_M$, and manages transactions and persists data to nodes. The USE enables global namespace management across geographically dispersed data centers through geo-replication.

In an aspect, the USE can write all object-related data (such as, user data, metadata, object location data) to logical containers of contiguous disk space known as chunks. Chunks are open and accepting writes, or closed and not accepting writes. After chunks are closed, the USE can erasure-code them. The USE can write to chunks in an append-only pattern so that existing data is never overwritten or modified. This strategy improves performance because locking and cache validation is not required for I/O operations. All nodes $904_1$-$904_M$ can process write requests for the same object simultaneously while writing to different chunks.

ECS™ continuously monitors the health of the nodes $904_1$-$904_M$, their disks, and objects stored in the cluster. ECS™ disperses data protection responsibilities across the cluster, it can automatically re-protect at-risk objects when nodes or disks fail. When there is a failure of a node or drive in the site, the USE can identify the chunks and/or erasure coded fragments affected by the failure and can write copies of the affected chunks and/or erasure coded fragments to good nodes and disks that do not currently have copies.

Private and hybrid clouds greatly interest customers, who are facing ever-increasing amounts of data and storage costs, particularly in the public cloud space. ECS™ provides a scale-out and geo-distributed architecture that delivers an on-premise cloud platform that scales to exabytes of data with a TCO (Total Cost of Ownership) that's significantly less than public cloud storage. Further, ECS™ provides versatility, hyper-scalability, powerful features, and use of low-cost industry standard hardware.

Figure 10:
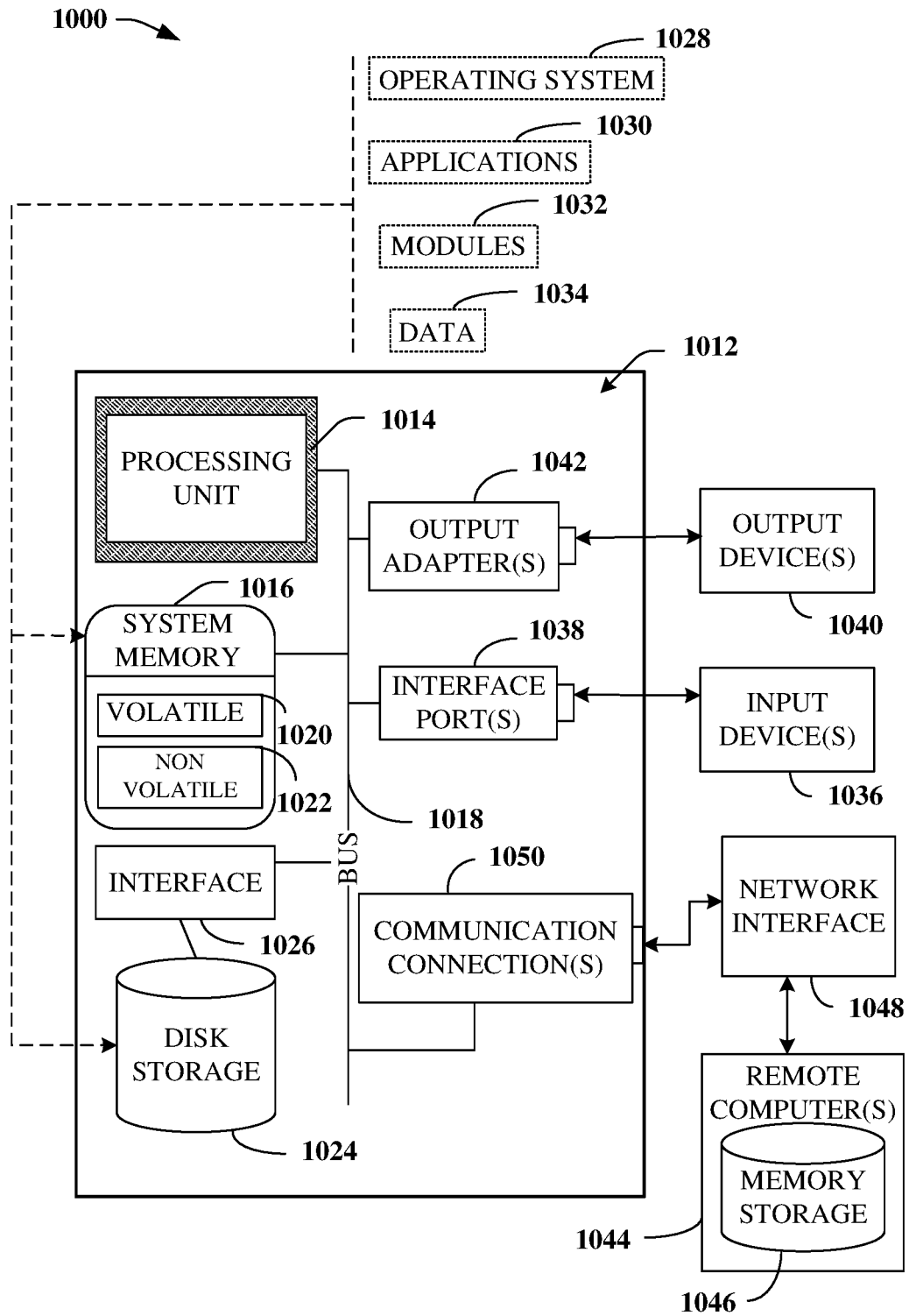
FIG. 10 illustrates a block diagram of an example computer operable to execute the disclosed distributed storage system architecture.

Referring now to FIG. 10, there is illustrated a block diagram of an example computer operable to execute data deletion with distributed erasure coding. In order to provide additional context for various aspects of the disclosed subject matter, FIG. 10 and the following discussion are intended to provide a brief, general description of a suitable computing environment 1000 in which the various aspects of the specification can be implemented. While the specification has been described above in the general context of computer-executable instructions that can run on one or more computers, those skilled in the art will recognize that the specification also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices. The illustrated aspects of the specification can also be practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media and/or communications media, which two terms are used herein differently from one another as follows. Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, (e.g., a carrier wave or other transport mechanism), and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, radio frequency (RF), infrared and other wireless media.

In order to provide a context for the various aspects of the disclosed subject matter, FIG. 10, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that various embodiments disclosed herein can be implemented in combination with other program modules. Generally, program modules comprise routines, programs, components, data structures, etc. that perform particular tasks and/or implement particular abstract data types.

Moreover, those skilled in the art will appreciate that the inventive systems can be practiced with other computer system configurations, comprising single-processor or multiprocessor computer systems, computing devices, mini-computing devices, mainframe computers, as well as personal computers, hand-held computing devices (e.g., PDA, phone, watch), microprocessor-based or programmable consumer or industrial electronics, and the like. The illustrated aspects can also be practiced in distributed computing environments where tasks are performed by remote processing devices that are linked through a communication network; however, some if not all aspects of the subject disclosure can be practiced on stand-alone computers. In a distributed computing environment, program modules can be located in both local and remote memory storage devices.

With reference to FIG. 10, a block diagram of a computing system 1000 operable to execute the disclosed systems and methods is illustrated, in accordance with an embodiment. Computer 1012 comprises a processing unit 1014, a system memory 1016, and a system bus 1018. As an example, the component(s), server(s), client(s), node(s), cluster(s), system(s), zone(s), module(s), agent(s), engine(s), and/or device(s) disclosed herein with respect to systems 100-600 and 800-900 can each include at least a portion of the computing system 1000. System bus 1018 couples system components comprising, but not limited to, system memory 1016 to processing unit 1014. Processing unit 1014 can be any of various available processors. Dual microprocessors and other multiprocessor architectures also can be employed as processing unit 1014.

System bus 1018 can be any of several types of bus structure(s) comprising a memory bus or a memory controller, a peripheral bus or an external bus, and/or a local bus using any variety of available bus architectures comprising, but not limited to, industrial standard architecture (ISA), micro-channel architecture (MSA), extended ISA (EISA), intelligent drive electronics (IDE), VESA local bus (VLB), peripheral component interconnect (PCI), card bus, universal serial bus (USB), advanced graphics port (AGP), personal computer memory card international association bus (PCMCIA), Firewire (IEEE 1394), small computer systems interface (SCSI), and/or controller area network (CAN) bus used in vehicles.

System memory 1016 comprises volatile memory 1020 and nonvolatile memory 1022. A basic input/output system (BIOS), comprising routines to transfer information between elements within computer 1012, such as during start-up, can be stored in nonvolatile memory 1022. By way of illustration, and not limitation, nonvolatile memory 1022 can comprise ROM, PROM, EPROM, EEPROM, or flash memory. Volatile memory 1020 comprises RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1012 also comprises removable/non-removable, volatile/non-volatile computer storage media. FIG. 10 illustrates, for example, disk storage 1024. Disk storage 1024 comprises, but is not limited to, devices like a magnetic disk drive, floppy disk drive, tape drive, Jaz drive, Zip drive, LS-100 drive, flash memory card, or memory stick. In addition, disk storage 1024 can comprise storage media separately or in combination with other storage media comprising, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1024 to system bus 1018, a removable or non-removable interface is typically used, such as interface 1026.

It is to be appreciated that FIG. 10 describes software that acts as an intermediary between users and computer resources described in suitable operating environment 1000. Such software comprises an operating system 1028. Operating system 1028, which can be stored on disk storage 1024, acts to control and allocate resources of computer system 1012. System applications 1030 take advantage of the management of resources by operating system 1028 through program modules 1032 and program data 1034 stored either in system memory 1016 or on disk storage 1024. It is to be appreciated that the disclosed subject matter can be implemented with various operating systems or combinations of operating systems.

A user can enter commands or information into computer 1012 through input device(s) 1036. Input devices 1036 comprise, but are not limited to, a pointing device such as a mouse, trackball, stylus, touch pad, keyboard, microphone, joystick, game pad, satellite dish, scanner, TV tuner card, digital camera, digital video camera, web camera, cellular phone, user equipment, smartphone, and the like. These and other input devices connect to processing unit 1014 through system bus 1018 via interface port(s) 1038. Interface port(s) 1038 comprise, for example, a serial port, a parallel port, a game port, a universal serial bus (USB), a wireless based port, e.g., Wi-Fi, Bluetooth®, etc. Output device(s) 1040 use some of the same type of ports as input device(s) 1036.

Thus, for example, a USB port can be used to provide input to computer 1012 and to output information from computer 1012 to an output device 1040. Output adapter 1042 is provided to illustrate that there are some output devices 1040, like display devices, light projection devices, monitors, speakers, and printers, among other output devices 1040, which use special adapters. Output adapters 1042 comprise, by way of illustration and not limitation, video and sound devices, cards, etc. that provide means of connection between output device 1040 and system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. Remote computer(s) 1044 can be a personal computer, a server, a router, a network PC, a workstation, a microprocessor based appliance, a peer device, or other common network node and the like, and typically comprises many or all of the elements described relative to computer 1012.

For purposes of brevity, only a memory storage device 1046 is illustrated with remote computer(s) 1044. Remote computer(s) 1044 is logically connected to computer 1012 through a network interface 1048 and then physically and/or wirelessly connected via communication connection 1050. Network interface 1048 encompasses wire and/or wireless communication networks such as local-area networks (LAN) and wide-area networks (WAN). LAN technologies comprise fiber distributed data interface (FDDI), copper distributed data interface (CDDI), Ethernet, token ring and the like. WAN technologies comprise, but are not limited to, point-to-point links, circuit switching networks like integrated services digital networks (ISDN) and variations thereon, packet switching networks, and digital subscriber lines (DSL).

Communication connection(s) 1050 refer(s) to hardware/software employed to connect network interface 1048 to bus 1018. While communication connection 1050 is shown for illustrative clarity inside computer 1012, it can also be external to computer 1012. The hardware/software for connection to network interface 1048 can comprise, for example, internal and external technologies such as modems, comprising regular telephone grade modems, cable modems and DSL modems, wireless modems, ISDN adapters, and Ethernet cards.

The computer 1012 can operate in a networked environment using logical connections via wired and/or wireless communications to one or more remote computers, cellular based devices, user equipment, smartphones, or other computing devices, such as workstations, server computers, routers, personal computers, portable computers, microprocessor-based entertainment appliances, peer devices or other common network nodes, etc. The computer 1012 can connect to other devices/networks by way of antenna, port, network interface adaptor, wireless access point, modem, and/or the like.

The computer 1012 is operable to communicate with any wireless devices or entities operatively disposed in wireless communication, e.g., a printer, scanner, desktop and/or portable computer, portable data assistant, communications satellite, user equipment, cellular base device, smartphone, any piece of equipment or location associated with a wirelessly detectable tag (e.g., scanner, a kiosk, news stand, restroom), and telephone. This comprises at least Wi-Fi and Bluetooth® wireless technologies. Thus, the communication can be a predefined structure as with a conventional network or simply an ad hoc communication between at least two devices.

The computing system 1000 is operable to communicate with any wireless devices or entities operatively disposed in wireless communication, e.g., desktop and/or portable computer, server, communications satellite, etc. This includes at least Wi-Fi and Bluetooth® wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 5 GHz radio band at a 54 Mbps (802.11a) data rate, and/or a 2.4 GHz radio band at an 11 Mbps (802.11b), a 54 Mbps (802.11g) data rate, or up to a 600 Mbps (802.11n) data rate for example, or with products that contain both bands (dual band), so the networks can provide real-world performance similar to the basic 10BaseT wired Ethernet networks used in many offices.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory in a single machine or multiple machines. Additionally, a processor can refer to an integrated circuit, a state machine, an application specific integrated circuit (ASIC), a digital signal processor (DSP), a programmable gate array (PGA) including a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units. One or more processors can be utilized in supporting a virtualized computing environment. The virtualized computing environment may support one or more virtual machines representing computers, servers, or other computing devices. In such virtualized virtual machines, components such as processors and storage devices may be virtualized or logically represented. In an aspect, when a processor executes instructions to perform "operations", this could include the processor performing the operations directly and/or facilitating, directing, or cooperating with another device or component to perform the operations In the subject specification, terms such as "data store," data storage," "database," "cache," and substantially any other information storage component relevant to operation and functionality of a component, refer to "memory components," or entities embodied in a "memory" or components comprising the memory. It is noted that the memory components, or computer-readable storage media, described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

The illustrated aspects of the disclosure can be practiced in distributed computing environments where certain tasks are performed by remote processing devices that are linked through a communications network. In a distributed computing environment, program modules can be located in both local and remote memory storage devices.

The systems and processes described above can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders that are not all of which may be explicitly illustrated herein.

As used in this application, the terms "component," "module," "system," "interface," "cluster," "server," "node," or the like are generally intended to refer to a computer-related entity, either hardware, a combination of hardware and software, software, or software in execution or an entity related to an operational machine with one or more specific functionalities. For example, a component can be, but is not limited to being, a process running on a processor, a processor, an object, an executable, a thread of execution, computer-executable instruction(s), a program, and/or a computer. By way of illustration, both an application running on a controller and the controller can be a component. One or more components may reside within a process and/or thread of execution and a component may be localized on one computer and/or distributed between two or more computers. As another example, an interface can include input/output (I/O) components as well as associated processor, application, and/or API components.

Furthermore, the terms "user," "consumer," "client," and the like are employed interchangeably throughout the subject specification, unless context warrants particular distinction(s) among the terms. It is noted that such terms can refer to human entities or automated components/devices supported through artificial intelligence (e.g., a capacity to make inference based on complex mathematical formalisms), which can provide simulated vision, sound recognition and so forth.

Further, the various embodiments can be implemented as a method, apparatus, or article of manufacture using standard programming and/or engineering techniques to produce software, firmware, hardware, or any combination thereof to control a computer to implement one or more aspects of the disclosed subject matter. An article of manufacture can encompass a computer program accessible from any computer-readable device or computer-readable storage/communications media. For example, computer readable storage media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Of course, those skilled in the art will recognize many modifications can be made to this configuration without departing from the scope or spirit of the various embodiments.

Artificial intelligence based systems, e.g., utilizing explicitly and/or implicitly trained classifiers, can be employed in connection with performing inference and/or probabilistic determinations and/or statistical-based determinations as in accordance with one or more aspects of the disclosed subject matter as described herein. For example, an artificial intelligence system can be used to dynamically perform operations as described herein.

A classifier can be a function that maps an input attribute vector, $x=(x1, x2, x3, x4, xn)$, to a confidence that the input belongs to a class, that is, $f(x)=confidence$ (class). Such classification can employ a probabilistic and/or statistical-based analysis (e.g., factoring into the analysis utilities and costs) to infer an action that a user desires to be automatically performed. In the case of communication systems, for example, attributes can be information received from access points, servers, components of a wireless communication network, etc., and the classes can be categories or areas of interest (e.g., levels of priorities). A support vector machine is an example of a classifier that can be employed. The support vector machine operates by finding a hypersurface in the space of possible inputs, which the hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein can also be inclusive of statistical regression that is utilized to develop models of priority.

In accordance with various aspects of the subject specification, artificial intelligence based systems, components, etc. can employ classifiers that are explicitly trained, e.g., via a generic training data, etc. as well as implicitly trained, e.g., via observing characteristics of communication equipment, e.g., a server, etc., receiving reports from such communication equipment, receiving operator preferences, receiving historical information, receiving extrinsic information, etc. For example, support vector machines can be configured via a learning or training phase within a classifier constructor and feature selection module. Thus, the classifier(s) can be used by an artificial intelligence system to automatically learn and perform a number of functions.

In addition, the word "example" or "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes examples of the present specification. It is, of course, not possible to describe every conceivable combination of components or methods for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
   a processor; and
   a memory that stores executable instructions that, when executed by the processor, facilitate performance of operations, comprising:
      determining a sequence for a recovery of erasure-coded fragments of data chunks stored within a cloud storage system, wherein the determining the sequence comprises sorting a list of the data chunks based on a total number of missing data fragments and coding fragments of the data chunks, wherein the list of the data chunks is sorted in a descending order, wherein the sequence is determined to reduce a likelihood of a data loss event and a data unavailability event associated with the data chunks, wherein the data loss event comprises a first error condition that occurs in response to determining that a defined number of first erasure-coded fragments of a first data chunk of the data chunks are lost, and wherein the data unavailability event comprises a second error condition that occurs in response to determining that second erasure-coded fragments of a second data chunk of the data chunks are unavailable when a read request has been received for the second data chunk; and
      facilitating the recovery of the erasure-coded fragments in the sequence.

2. The system of claim 1, wherein the operations further comprise:
   determining that a failure criterion associated with the cloud storage system has been satisfied, and wherein the determining the sequence is in response to the determining that the failure criterion has been satisfied.

3. The system of claim 1, wherein the operations further comprise:
   based on the total number of missing data fragments and coding fragments, determining groups of the data chunks.

4. The system of claim 3, wherein a set of the data chunks within a group of the groups is determined to have a common number of missing fragments.

5. The system of claim 3, wherein the operations further comprise:
   based on a number of missing data fragments, sorting a set of the data chunks within a group of the groups, and wherein the sorting results in the determining the sequence.

6. The system of claim 5, wherein the descending order is a first descending order, and wherein the sorting the set of the data chunks comprises sorting the set of the data chunks in a second descending order.

7. The system of claim 1, wherein the facilitating the recovery comprises facilitating the recovery based on a result of decoding matrix data.

8. The system of claim 1, wherein the operations further comprise:
   subsequent to the recovery of the erasure-coded fragments, storing the erasure-coded fragments to one or more node devices of the cloud storage system.

9. The system of claim 1, wherein the cloud storage system comprises an object storage system.

10. A method, comprising:
    determining, by a system comprising a processor, a group of data chunks having one or more missing erasure-coded fragments, wherein the determining comprises determining the group of data chunks in a first sequence;
    sorting the group of data chunks to reduce a first probability of a data loss event, wherein the sorting comprises sorting the group of data chunks based on a total number of missing data fragments and coding fragments associated with the group of data chunks in a descending order, wherein the data loss event comprises a first error that is to be generated in response to determining that at least a defined number of first erasure-coded fragments of a first data chunk of the group of data chunks are lost;
    re-sorting a subgroup of the group of data chunks to reduce a second probability of a data unavailability event, wherein the data unavailability event comprises a second error that to be generated in response to determining that second erasure-coded fragments of a second data chunk of the group of data chunks are unavailable when a read request has been received for the second data chunk, and wherein the re-sorting results in a determined sequence of the group of data chunks; and
    initiating a recovery of the group of data chunks in the determined sequence.

11. The method of claim 10, further comprising:
    based on the total number of missing data fragments and coding fragments associated with the group of data chunks, determining subgroups of the group of data chunks.

12. The method of claim 11, wherein the re-sorting comprises re-sorting the subgroup of the subgroups.

13. The method of claim 11, wherein the determining the subgroups comprises determining a defined number of subgroups, and wherein the defined number is determined based on an erasure coding protocol utilized to encode the group of data chunks.

14. The method of claim 10, wherein the initiating the recovery comprises facilitating a performance of a matrix-based decoding operation to recover the group of data chunks.

15. The method of claim 10, wherein the descending order is a first descending order, and wherein the re-sorting the subgroup of the group of data chunks comprises re-sorting the subgroup of the group of data chunks in a second descending order.

16. A non-transitory computer-readable medium comprising instructions that, in response to execution, cause a server device comprising a processor to perform operations, comprising:

determining a sequence for a recovery of erasure-coded fragments of data chunks stored within a cloud storage system, wherein the sequence is determined to decrease a frequency of a potential data loss event and a potential data unavailability event associated with the data chunks, wherein the determining the sequence comprises sorting a list of the data chunks based on a total number of missing data fragments and coding fragments of the data chunks to generate a sorted list of the data chunks in a descending order, wherein the potential data loss event comprises a first error condition that occurs in response to determining that a defined number of first erasure-coded fragments of a first data chunk of the data chunks are lost, and wherein the potential data unavailability event comprises a second error condition that occurs in response to determining that second erasure-coded fragments of a second data chunk of the data chunks are unavailable when a read request has been received for the second data chunk; and facilitating the recovery of the erasure-coded fragments in the sequence.

17. The non-transitory computer-readable medium of claim 16, wherein the operations further comprise:
segmenting the sorted list of the data chunks into a defined set of data chunk groups, wherein a set of the data chunks within a group of the defined set of data chunk groups are determined to have a common total number of missing data fragments and coding fragments.

18. The non-transitory computer-readable medium of claim 17, wherein the operations further comprise:
re-sorting the set of the data chunks based on a number of missing data fragments of the set of the data chunks to facilitate a determination of the sequence.

19. The non-transitory computer-readable medium of claim 18, wherein the descending order is a first descending order, and wherein the re-sorting the set of the data chunks comprises re-sorting the set of the data chunks in a second descending order.

20. The non-transitory computer-readable medium of claim 16, wherein the cloud storage system comprises a distributed object storage system.

* * * * *